United States Patent
Grandusky et al.

(10) Patent No.: US 11,355,664 B2
(45) Date of Patent: Jun. 7, 2022

(54) ALUMINUM NITRIDE SUBSTRATE REMOVAL FOR ULTRAVIOLET LIGHT-EMITTING DEVICES

(71) Applicants: James R. Grandusky, Waterford, NY (US); Leo J. Schowalter, Latham, NY (US); Craig Moe, Latham, NY (US)

(72) Inventors: James R. Grandusky, Waterford, NY (US); Leo J. Schowalter, Latham, NY (US); Craig Moe, Latham, NY (US)

(73) Assignee: CRYSTAL IS, INC., Green Island, NY (US)

( * ) Notice: Subject to any disclaimer, the term of this patent is extended or adjusted under 35 U.S.C. 154(b) by 22 days.

(21) Appl. No.: 16/929,634

(22) Filed: Jul. 15, 2020

(65) Prior Publication Data

US 2020/0411716 A1    Dec. 31, 2020

Related U.S. Application Data

(63) Continuation of application No. 15/977,031, filed on May 11, 2018, now Pat. No. 10,756,234.

(60) Provisional application No. 62/505,325, filed on May 12, 2017.

(51) Int. Cl.
| | |
|---|---|
| *H01L 33/32* | (2010.01) |
| *H01L 33/00* | (2010.01) |
| *H01L 33/20* | (2010.01) |
| *H01L 21/78* | (2006.01) |

(52) U.S. Cl.
CPC ...... *H01L 33/0093* (2020.05); *H01L 21/7806* (2013.01); *H01L 33/20* (2013.01); *H01L 33/32* (2013.01)

(58) Field of Classification Search
CPC .. H01L 33/0079; H01L 21/7806; H01L 33/20; H01L 33/32
USPC .......................................................... 438/46
See application file for complete search history.

(56) References Cited

U.S. PATENT DOCUMENTS

| | | | |
|---|---|---|---|
| 6,627,518 B1 * | 9/2003 | Inoue | H01L 23/48 438/458 |
| 8,173,519 B2 * | 5/2012 | Morisue | G02F 1/133711 438/458 |
| 8,329,511 B2 | 12/2012 | D'Evelyn | |
| 8,664,019 B2 * | 3/2014 | Lee | H01L 33/0093 438/29 |
| 8,664,087 B2 * | 3/2014 | Chang | H01L 21/02458 438/459 |
| 8,698,191 B2 | 4/2014 | Khan | |
| 8,729,559 B2 | 5/2014 | Krames | |
| 8,742,396 B2 * | 6/2014 | Ooshika | H01L 33/04 257/15 |
| 8,829,544 B2 * | 9/2014 | Hikosaka | H01L 33/48 257/94 |
| 9,224,911 B2 | 12/2015 | Yen | |
| 9,530,986 B2 * | 12/2016 | Okumoto | H01L 51/003 |

(Continued)

OTHER PUBLICATIONS

International Search Report and Written Opinion, International Application No. PCT/US2018/032196, dated Sep. 13, 2018, 18 pages.

*Primary Examiner* — Vu A Vu
(74) *Attorney, Agent, or Firm* — Morgan, Lewis & Bockius LLP

(57) ABSTRACT

In various embodiments, extraction efficiency of light-emitting devices fabricated on aluminum nitride substrates is enhanced via removal of at least a portion of the substrate.

38 Claims, 5 Drawing Sheets

(56) References Cited

U.S. PATENT DOCUMENTS

| | | |
|---|---|---|
| 2004/0113166 A1 | 6/2004 | Tadatomo et al. |
| 2007/0101932 A1 | 5/2007 | Schowalter et al. |
| 2008/0049802 A1 | 2/2008 | Kim et al. |
| 2011/0073838 A1 | 3/2011 | Khan et al. |
| 2012/0178215 A1 | 7/2012 | D'Evelyn |
| 2015/0263229 A1* | 9/2015 | Akiyama ................ H01L 33/20 257/99 |
| 2017/0372965 A1* | 12/2017 | Nishibayashi .... H01L 21/02433 |
| 2018/0076355 A1* | 3/2018 | Hayashi .............. H01L 33/0095 |
| 2018/0331253 A1 | 11/2018 | Grandusky et al. |

* cited by examiner

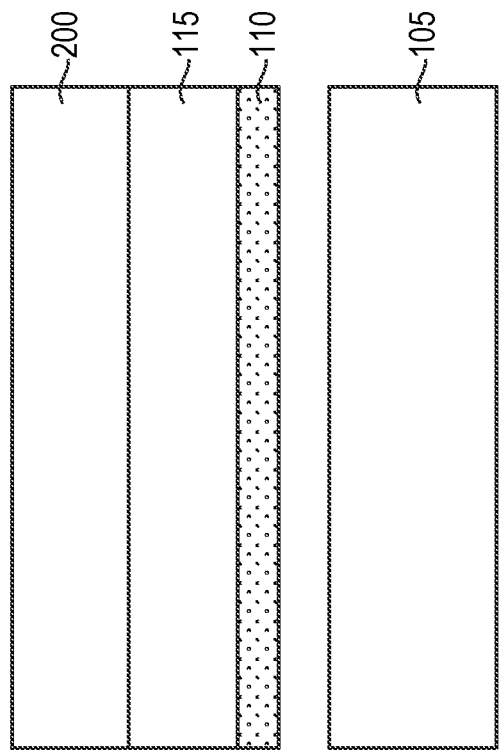
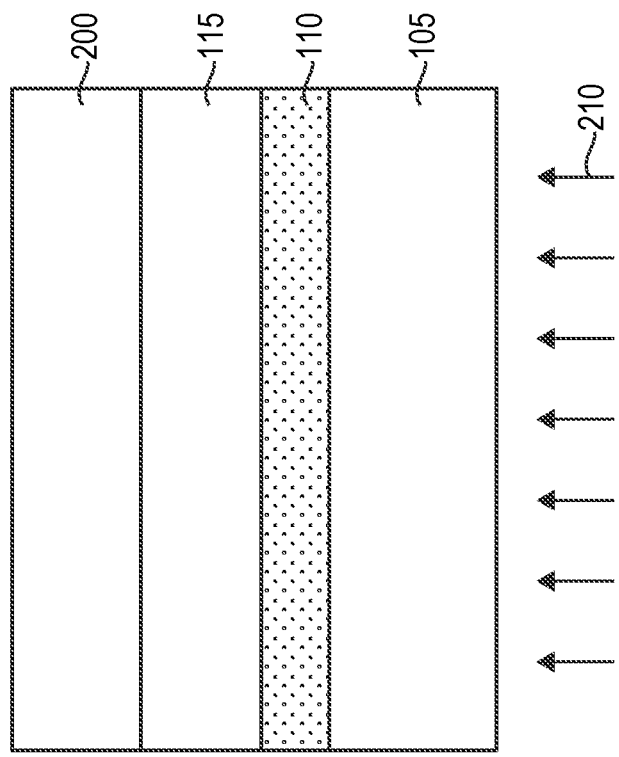
FIG. 2B
FIG. 2A

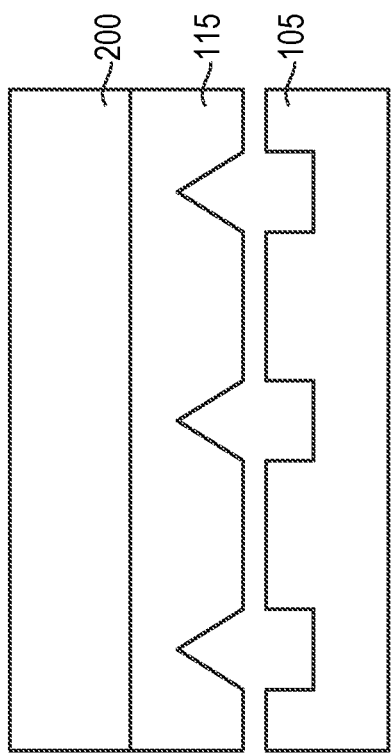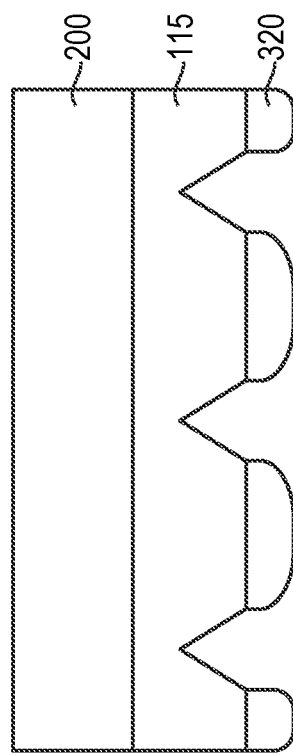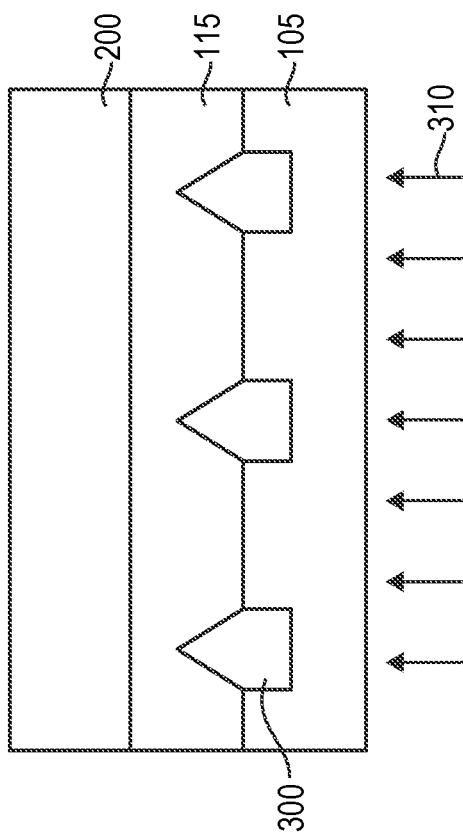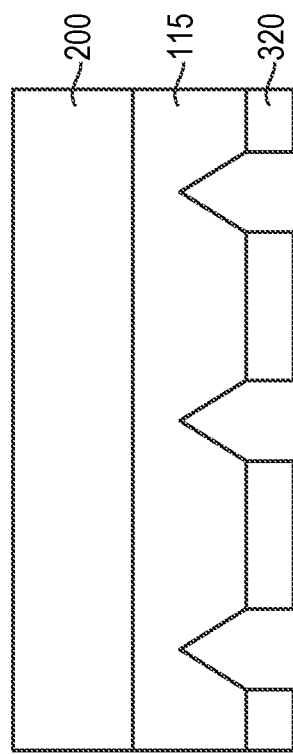

ALUMINUM NITRIDE SUBSTRATE REMOVAL FOR ULTRAVIOLET LIGHT-EMITTING DEVICES

RELATED APPLICATION

This application is a continuation of U.S. patent application Ser. No. 15/977,031, filed May 11, 2018, which claims the benefit of and priority to U.S. Provisional Patent Application No. 62/505,325, filed May 12, 2017, the entire disclosure of each of which is hereby incorporated herein by reference.

TECHNICAL FIELD

In various embodiments, the present invention relates to ultraviolet optoelectronic devices, in particular to improving light extraction therefrom via reduction of substrate absorption.

BACKGROUND

The output powers, efficiencies, and lifetimes of short-wavelength ultraviolet light-emitting diodes (UV LEDs), i.e., LEDs that emit light at wavelengths less than 350 nm, based on the nitride semiconductor system remain limited due to high defect levels in the active region. These limitations are particularly problematic (and notable) in devices designed to emit at wavelengths less than 270 nm. Most development effort has been carried out on devices formed on foreign substrates such as sapphire where defect densities remain high despite innovative defect reduction strategies. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces bonded to a polycrystalline (ceramic) AlN submount. Because of the high crystalline perfection that is achievable in the active device region of such devices, internal efficiencies greater than 60% have been demonstrated. Unfortunately, the photon-extraction efficiency is often still very poor in these devices, ranging from about 4% to about 15% achieved using surface-patterning techniques.

For several reasons, the photon extraction efficiency from short-wavelength UV LEDs is poor compared to visible LEDs. Thus, the current generation of commercial short-wavelength UV LEDs has low wall-plug efficiencies (WPE) of, at best, only a few percent, where WPE is defined as the ratio of usable optical power (in this case, emitted UV light) achieved from the diode divided by the electrical power into the device, and the best reported "hero" devices have claimed WPE of just over 10%. The WPE of an LED can be calculated by taking the product of the electrical efficiency ($\eta_{el}$), the photon extraction efficiency ($\eta_{ex}$), and the internal efficiency (IE); i.e., WPE=$\eta_{el} \times \eta_{ex} \times$IE. The IE itself is the product of current injection efficiency ($\eta_{inj}$) and the internal quantum efficiency (IQE); i.e., IE=$\eta_{inj} \times$IQE. Thus, a low $\eta_{ex}$ will deleteriously impact the WPE even after the IE has been improved via the reduction of internal crystalline defects enabled by, e.g., the use of the AlN substrates referenced above as platforms for the devices.

Several issues can contribute to low photon-extraction efficiency. First, even the highest-quality AlN substrates available generally have some absorption in the UV wavelength range, even at wavelengths longer than the band edge in AlN (which is approximately 210 nm). This absorption tends to result in some of the UV light generated in the active area of the device being absorbed in the substrate, hence diminishing the amount of light emitted from the substrate surface. Additionally, UV LEDs suffer because approximately half of the generated photons are directed toward the p-contact and absorbed by the p-GaN of that contact. Even when photons are directed toward the AlN surface, only 9.4% can escape from an untreated surface due to the large index of refraction of the AlN, which results in a small escape cone. Additional photons are lost on their way to the exit surface due to absorption in the AlN wafer. These losses are multiplicative and the average photon extraction efficiency is only about 2.5%.

Since photon absorption by the AlN substrate and the high refractive index contrast between air and AlN deleteriously impact the photon-extraction efficiency of UV LEDs on AlN, these effects may be ameliorated via removal of all or a portion of the substrate. Various techniques have been developed for removal of substrates in other materials systems, but such techniques are generally not effective when utilized for UV LEDs on AlN substrates. Moreover, encapsulation techniques utilizing rigid lenses have been utilized to enhance photon-extraction efficiency—see, e.g., U.S. Pat. No. 8,962,359, filed on Jul. 19, 2012, the entire disclosure of which is incorporated by reference herein—but such techniques generally do not address substrate absorption, nor do they address the issue of photons that are propagating at very small angles to the interface and which are therefore unlikely to escape from a thick substrate.

In view of the foregoing, there is a need for improved techniques for the removal of all or a portion of an AlN substrate of a UV light-emitting device.

SUMMARY

In various embodiments of the present invention, the photon-extraction efficiency and external quantum efficiency of UV light-emitting devices such as UV LEDs are improved via removal of all or a portion of the AlN substrates on which the devices are fabricated. In various embodiments, UV light-emitting device structures incorporating one or more release layers therein are deposited over AlN substrates, and subsequent application of light and/or heat to the release layer induces fracture therein, releasing the device structure from the original AlN substrate. In various embodiments, the release layer is substantially lattice-matched to the AlN substrate (and/or to one or more portions of the overlying device structure), but it has a different absorption coefficient at one or a range of wavelengths (for fracture-facilitating absorption of light), and/or a different coefficient of thermal expansion that results in fracture-facilitating thermal expansion mismatch when heat is applied.

In other embodiments, the use of a release layer is replaced with or supplemented by the fabrication of the UV light-emitting device structure over a patterned AlN substrate. Epitaxial growth of the device structure over the patterned substrate proceeds not only vertically but horizontally over the pattern in the substrate, resulting in the formation of voids (containing, e.g., air or another gas) at the interface between the substrate and the device structure. Upon application of energy (e.g., heat and/or light) to the substrate, the voids advantageously act as nucleation points for fracture at the interface, resulting in separation of the device structure from the substrate.

The voids resulting from deposition of the device structure over a patterned AlN substrate may also be utilized as a stop layer for physical removal of the substrate via techniques such as grinding, polishing, and/or etching. Such removal processes may be utilized until the voids are revealed, at which point only small portions of the substrate remain attached to the device structure between the voids. These small substrate portions may be removed by, e.g., further grinding or polishing, and/or via selective etching. In various embodiments, the small remnant substrate portions may be shaped in order to promote photon extraction from the overlying device structure. For example, the substrate portions may be etched or polished to have a substantially hemispherical shape to promote light extraction from the device structure.

References made herein to AlGaN or $Al_{1-a}Ga_aN$ alloys and layers (a being any subscript that may be provided in references to AlGaN herein) are understood to optionally include indium (In) unless the alloy or layer in question is specifically described as being substantially free of In; thus, references made herein to AlGaN or $Al_{1-a}Ga_aN$ are understood to be equivalent to AlInGaN or $Al_{1-a-b}Ga_aIn_bN$ unless otherwise specified. As utilized herein, a layer or alloy being "substantially free of In" means that the layer or alloy is free of In in any but trace amounts, which may be detectable via chemical analysis but do not affect band gap or other properties of the layer or alloy by more than 1% (or, in some embodiments, by more than 0.5% or by more than 0.1%).

In an aspect, embodiments of the invention feature a method of forming an illumination device. A release layer is formed over an aluminum nitride substrate, the release layer having an absorption band corresponding to (e.g., approximately equal to) a first wavelength of light. An active light-emitting device structure is formed over the release layer. The release layer is exposed to light having the first wavelength, whereby absorption of the light by the release layer results in separation of at least a portion of the substrate from the active light-emitting device structure.

Embodiments of the invention may include one or more of the following in any of a variety of combinations. Forming the release layer may include, consist essentially of, or consist of depositing aluminum nitride and/or AlGaN and intentionally introducing one or more dopants into at least a portion of the aluminum nitride and/or AlGaN. The one or more dopants may include, consist essentially of, or consist of oxygen and/or carbon. The aluminum nitride substrate may be single-crystalline. Before the release layer is exposed to the light having the first wavelength, the active light-emitting device structure may be attached to a handle wafer. The release layer may be exposed to light through the aluminum nitride substrate. At least a portion of the aluminum nitride substrate may be substantially transparent to light having the first wavelength. Heat may be applied to the aluminum nitride substrate and/or to the release layer. The release layer may be substantially lattice-matched to the aluminum nitride substrate. The release layer may have a thermal conductivity lower than a thermal conductivity of the aluminum nitride substrate.

In another aspect, embodiments of the invention feature a method of forming an illumination device. An aluminum nitride substrate having a patterned top surface defining a plurality of protruding pillars is provided. An active light-emitting device structure is deposited over the patterned top surface of the aluminum nitride substrate, whereby voids are formed at the interface between the aluminum substrate and the active light-emitting device structure via lateral growth of at least a portion of the active light-emitting device structure. One or more (or even all) of the voids may be enclosed. Radiation is applied proximate the voids, whereby heating of the voids and/or material therebetween by the radiation results in separation of at least a portion of the substrate from the active light-emitting device structure.

Embodiments of the invention may include one or more of the following in any of a variety of combinations. The active light-emitting device structure may include, proximate (e.g., at) the interface between the aluminum substrate and the active light-emitting device structure, a release layer having an absorption band corresponding to a first wavelength of light. At least a portion of the radiation applied to the voids may include, consist essentially of, or consist of light of the first wavelength. Forming the release layer may include, consist essentially of, or consist of depositing aluminum nitride and/or AlGaN and intentionally introducing one or more dopants into at least a portion of the aluminum nitride and/or AlGaN. The one or more dopants may include, consist essentially of, or consist of oxygen and/or carbon. The release layer may be substantially lattice-matched to the aluminum nitride substrate. The release layer may have a thermal conductivity lower than a thermal conductivity of the aluminum nitride substrate. The aluminum nitride substrate may be single-crystalline. Before the radiation is applied, the active light-emitting device structure may be attached to a handle wafer. The voids may be exposed to light through the aluminum nitride substrate. Heat may be applied to the aluminum nitride substrate, one or more of the voids, and/or to the release layer (if present).

In yet another aspect, embodiments of the invention feature a method of forming an illumination device. An aluminum nitride substrate having a patterned top surface defining a plurality of protruding pillars is provided. An active light-emitting device structure is deposited over the patterned top surface of the aluminum nitride substrate, whereby voids are formed at the interface between the aluminum substrate and the active light-emitting device structure via lateral growth of at least a portion of the active light-emitting device structure. One or more (or even all) of the voids may be enclosed. A first portion of the aluminum nitride substrate is removed to thereby open and/or enlarge an opening of at least one of the voids. One or more additional portions of the aluminum nitride substrate remain disposed on the active light-emitting device structure between the voids.

Embodiments of the invention may include one or more of the following in any of a variety of combinations. The substrate may include, below or at the interface between the aluminum substrate and the active light-emitting device structure, a release layer having an absorption band corresponding to a first wavelength of light. The first portion of the aluminum nitride substrate may be removed, at least in part, via application of radiation of the first wavelength. The release layer may include, consist essentially of, or consist of aluminum nitride and/or AlGaN including one or more dopants. The one or more dopants may include, consist essentially of, or consist of oxygen and/or carbon. The release layer may be substantially lattice-matched to the aluminum nitride substrate. The release layer may have a thermal conductivity lower than a thermal conductivity of the aluminum nitride substrate. The aluminum nitride substrate may be single-crystalline. Before the first portion of the aluminum nitride substrate is removed, the active light-emitting device structure may be attached to a handle wafer. Heat may be applied to the aluminum nitride substrate, one or more of the voids, and/or to the release layer (if present). At least a portion of the first portion of the aluminum nitride substrate may be removed by etching, grinding, and/or polishing. At least one of the additional portions of the aluminum nitride substrate may be shaped (e.g., by etching, non-conformal etching, and/or polishing). The shape of the at least one shaped additional portion may enhance photon extraction from the active light-emitting device structure.

In another aspect, embodiments of the invention feature an illumination device that includes, consists essentially of, or consists of a first contact layer having a first polarity, a second contact layer having a second polarity opposite the first polarity, and a light-emitting structure disposed between the first and second contact layers. At least a portion of the second contact layer defines a plurality of pillars separated by recesses disposed therebetween. The light-emitting structure includes, consists essentially of, or consists of a multiple-quantum well layer that includes, consists essentially of, or consists of a plurality of periods each including, consisting essentially of, or consisting of a $Al_xGa_{1-x}N$ barrier (which may be strained) and a $Al_yGa_{1-y}N$ quantum well (which may be strained). x and y are different by an amount facilitating confinement of charge carriers in the multiple-quantum well layer, and y may be selected for emission of ultraviolet light by the light-emitting structure. The illumination device also includes a single-crystalline aluminum nitride cap disposed on a top surface of one or more (e.g., each) of the pillars defined by the second contact layer.

Embodiments of the invention may include one or more of the following in any of a variety of combinations. One or more of the aluminum nitride caps may have a top surface, at least a portion (or even all) of which is curved. One or more of the aluminum nitride caps may be substantially hemispherical, substantially conical, or substantially pyramidal. The device may include a first electrical contact (e.g., a metallic contact) disposed in contact with the first contact layer and/or a second electrical contact (e.g., a metallic contact) disposed in contact with the second contact layer. A handle wafer may be affixed to the first contact layer and/or to one or more of the caps. The handle wafer may include, consist essentially of, or consist of glass, sapphire, quartz, a metallic material, and/or a ceramic material. At least a portion of the handle wafer may be reflective to light emittable by the light-emitting structure.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 2A is a schematic cross-section of a light-emitting device structure bonded to a handle wafer in accordance with various embodiments of the invention;

FIG. 2B is a schematic cross-section of the structure of FIG. 2A after separation of the substrate in accordance with embodiments of the invention;

FIG. 3A is a schematic cross-section of a light-emitting device structure bonded to a handle wafer in accordance with various embodiments of the invention;

FIG. 3B is a schematic cross-section of the structure of FIG. 3A after separation of the substrate in accordance with embodiments of the invention;

FIG. 3C is a schematic cross-section of a light-emitting device structure after removal of a portion of a substrate thereof in accordance with embodiments of the invention;

FIG. 3D is a schematic cross-section of the structure of FIG. 3C after application of a shaping treatment to substrate portions thereof in accordance with embodiments of the invention;

DETAILED DESCRIPTION

Figure 1:
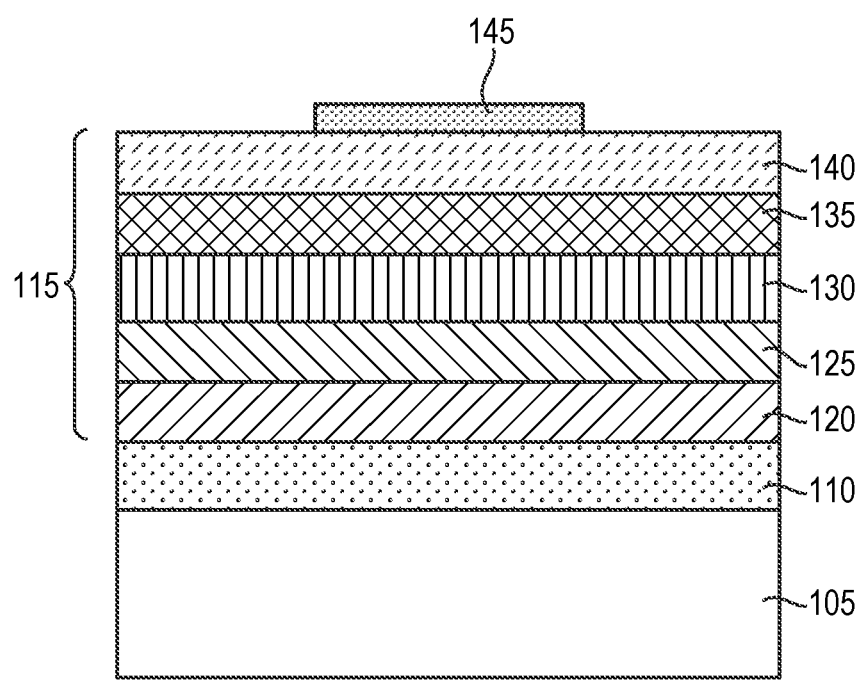
FIG. 1 is a schematic cross-section of a light-emitting device structure in accordance with various embodiments of the invention.

FIG. 1 schematically depicts a light-emitting device structure 100 in accordance with embodiments of the present invention. Light-emitting device structures 100 in accordance with embodiments of the invention may include, consist essentially of, or consist of, for example, light-emitting diodes or lasers. As shown, the device structure 100 includes a substrate 105, which in various embodiments includes, consists essentially of, or consists of aluminum nitride, e.g., single-crystal aluminum nitride. In various embodiments, the substrate 105 is not transparent (at least not fully transparent) to radiation emitted by the device structure 100 (e.g., UV radiation), and thus removal of all or a portion of the substrate 105 typically improves the photon extraction from the device structure 100. Substrate 105 may be miscut such that the angle between its c-axis and its surface normal is between approximately 0° and approximately 4°. In various embodiments, the misorientation of the surface of substrate 105 is less than approximately 0.3°, e.g., for substrates 105 that are not deliberately or controllably miscut. In other embodiments, the misorientation of the surface of substrate 105 is greater than approximately 0.3°, e.g., for substrates 105 that are deliberately and controllably miscut. In various embodiments, the direction of the miscut is towards the a-axis.

The surface of substrate 105 may have a group-III (e.g., Al-) polarity, and may be planarized, e.g., by chemical-mechanical polishing. The RMS surface roughness of substrate 105 may be less than approximately 0.5 nm for a 10 μm×10 μm area. In some embodiments, atomic-level steps are detectable on the surface when probed with an atomic-force microscope. The threading dislocation density of substrate 105 may be measured using, e.g., etch pit density measurements after a 5 minute KOH—NaOH eutectic etch at 450° C. In various embodiments, the threading dislocation density is less than approximately $2\times10^3$ cm$^{-2}$. In some embodiments substrate 105 has an even lower threading dislocation density. Substrate 105 may be topped with a homoepitaxial layer (not shown) that includes, consists essentially of, or consists of doped or undoped AlN.

The various layers of device structure 100 disposed over substrate 105 may be formed by any of a variety of different techniques, e.g., epitaxial growth techniques such as chemical vapor deposition (CVD) methods such as metallorganic CVD (MOCVD).

In accordance with embodiments of the present invention, a release layer 110 is disposed over the substrate 105 to facilitate later removal of all or a portion of the substrate 105 from the rest of device structure 100. In various embodiments, the release layer 110 is substantially lattice-matched to the substrate 105. Minimizing the lattice mismatch between the release layer 110 and the substrate 105 advantageously reduces or eliminates, for example, cracking and/or defect introduction in the release layer 110 and island formation (i.e., three-dimensional growth) during growth of the release layer 110. (As used herein, a layer that is "substantially lattice-matched" to a substrate or another layer has an unstrained lattice parameter sufficiently close to that of the substrate or other layer to enable epitaxial growth of the layer thereover such that the layer is approximately lattice-relaxed, or tensilely or compressively strained without significant strain relaxation (e.g., less than 20% relaxation, or even less than 10% relaxation), and/or to enable epitaxial growth of the layer without introduction of cracks and/or defects (e.g., dislocations) at densities exceeding those, if any, present in the underlying substrate or layer.) In various embodiments, the lattice mismatch between the release layer 110 and the substrate 105 is less than ±5%, less than ±3%, less than ±2%, less than ±1%, less than ±0.5%, less than ±0.2%, or less than ±0.1%. In various embodiments, it may be preferable to reduce the lattice mismatch when the release layer 110 is tensilely strained (i.e., the in-plane lattice spacing is smaller than that of substrate 105) in order to minimize or eliminate stress-relieving cracking in the release layer 110. In various embodiments, when the release layer 110 is compressively strained, the lattice mismatch to the substrate 105 may be larger but may be a function of the thickness of release layer 110. For example, compressively strained release layers 110 having too much lattice mismatch to the substrate 105 and too large a thickness may island during layer growth. Thus, in various embodiments, a release layer 110 having a compressive lattice mismatch with substrate 105 of approximately 3% may have a thickness no more than approximately 10 nm. For layers with less lattice mismatch, the thickness may be larger.

In various embodiments, the release layer 110 includes, consists essentially of, or consists of AlN or AlGaN doped with one or more impurities that form an absorption band within the release layer 110 for a wavelength of light not strongly absorbed by the substrate 105 itself. For example, the release layer 110 may include, consist essentially of, or consist of AlN doped with oxygen, which has an absorption band at approximately 310 nm. Since the AlN substrate 105 does not strongly absorb light having wavelengths larger than approximately 300 nm, absorption of light within, and concomitant local heating of, the release layer 110 may be utilized to remove the substrate 105 from the device structure 100, as detailed below. In various embodiments, the release layer 110 may be doped with oxygen (O) and/or one or more other dopants, for example, carbon (C), iron (Fe), manganese (Mn), or gadolinium (Gd). Such dopants may be introduced (e.g., as an additional gaseous species) during epitaxial growth of the release layer 110. In other embodiments, some or all of the dopant may be introduced after epitaxial growth of at least a portion of the release layer 110 by techniques such as ion implantation or dopant diffusion (e.g., from a solid or gaseous source). In various embodiments of the invention, one or more of the dopants may be introduced into and/or present within the release layer 110 at a concentration of at least for example, approximately $10^{17}$ cm$^{-3}$, at least approximately $10^{18}$ cm$^{-3}$, or even at least $10^{19}$ cm$^{-3}$. In various embodiments of the invention, one or more of the dopants may be introduced into and/or present within the release layer 110 at a concentration of at most for example, approximately $10^{20}$ cm$^{-3}$, or at most approximately $10^{21}$ cm$^{-3}$.

In exemplary embodiments, a release layer 110 including, consisting essentially, or consisting of AlN doped with oxygen may exhibit an absorption band at a wavelength of approximately 310 nm, and a release layer 110 including, consisting essentially, or consisting of AlN doped with carbon may exhibit an absorption band at a wavelength of approximately 265 nm. In such embodiments, radiation for substrate separation may be applied via, for example, a KrF laser (emission wavelength of approximately 248 nm) or a XeCl laser (emission wavelength of approximately 308 nm).

In various embodiments, release layer 110 may include, consist essentially of, or consist of a semiconductor other than AlN (e.g., AlGaN), and which may contain one or more dopants forming one or more absorption bands for light that is not strongly absorbed by substrate 105. In various embodiments, the release layer 110 may include, consist essentially of, or consist of a nitride alloy containing one or more of boron, aluminum, gallium, and/or indium. The release layer 110 may even include, consist essentially of, or consist of silicon carbide or a metal nitride (in which the metal is, e.g., one or more of Sc, Y, La, Ti, or Ta). For example, a release layer 110 including, consisting essentially, or consisting of silicon carbide may exhibit an absorption band at a wavelength of approximately 376 nm, and a release layer 110 including, consisting essentially, or consisting of titanium nitride may exhibit an absorption band at a wavelength of approximately 365 nm. In various embodiments, the release layer 110 is substantially lattice-matched to substrate 105.

In various embodiments, multiple release layers 110 may be present within device structure 100, and each release layer 110 may have one or more absorption bands different from one or all absorption bands in the other release layer(s) 110. For example, multiple release layers 110 including, consisting essentially of, or consisting of AlN or AlGaN may be formed (e.g., epitaxially grown), where each release layer 110 is doped with a different one of the dopants referred to above. In various embodiments, one or more release layers 110 may be tensilely strained with respect to the substrate 105, and/or one or more release layers 110 may be compressively strained with respect to the substrate 105.

In various embodiments, in addition to release layer 110, the substrate 105 may contain therewithin a release layer, and this substrate release layer may have an absorption band that is the same as or different from that of release layer 110. As explained in further detail below, exposure of the substrate release layer to radiation of approximately its absorption band enables the removal of the portion of the substrate 105 underlying the substrate release layer; thereafter, exposure of release layer 110 to radiation of approximately its absorption band enables the removal of any remaining portion of the substrate 105 and/or other layer(s) below release layer 110.

Device structure 100 also includes an active light-emitting structure 115 disposed over the release layer 110, as shown in FIG. 1. For example, the active structure 115 may include a bottom contact layer 120. In various embodiments, the bottom contact layer 120 is n-type doped, e.g., doped with an impurity such as P, As, Sb, C, H, F, O, Mg, and/or Si. The bottom contact layer 120 may include, consist essentially of, or consist of, for example, AlN or $Al_xGa_{1-x}N$. In an embodiment, an optional graded buffer layer (not shown) is disposed above substrate 105 and below bottom contact layer 120 (and, in various embodiments, below the release layer 110). The graded buffer layer may include, consist essentially of, or consist of one or more semiconductor materials, e.g., $Al_xGa_{1-x}N$. In various embodiments, the graded buffer layer has a composition approximately equal to that of substrate 105 at the bottom interface of the graded buffer layer in order to promote two-dimensional growth and avoid deleterious islanding (such islanding may result in undesired elastic strain relief and/or surface roughening in the graded buffer layer and subsequently grown layers). The composition of the graded buffer layer at an interface with bottom contact layer 120 (or release layer 110) may be chosen to be close to (e.g., approximately equal to) that of the desired active region of the device (e.g., the $Al_xGa_{1-x}N$ concentration that will result in the desired wavelength emission from the light-emitting device). In an embodiment, the graded buffer layer includes, consists essentially of, or consists of doped or undoped $Al_xGa_{1-x}N$ graded from an Al concentration x of approximately 100% to an Al concentration x ranging from approximately 60% to approximately 85%.

The bottom contact layer 120 may have a thickness sufficient to prevent current crowding after device fabrication and/or to stop on during etching to fabricate contacts. For example, the thickness of bottom contact layer 120 may range from approximately 100 nm to approximately 500 nm, or from approximately 100 nm to approximately 2 μm. When utilizing a bottom contact layer 120, the final light-emitting device may be fabricated with back-side contacts. In various embodiments, bottom contact layer 120 will have high electrical conductivity even with a small thickness due to the low defect density maintained when the layer is pseudomorphic. As utilized herein, a pseudomorphic film is one where the strain parallel to the interface between the film and an underlying layer or substrate is approximately that needed to distort the lattice in the film to match that of the substrate (or a relaxed, i.e., substantially unstrained, layer over the substrate and below the pseudomorphic film). Thus, the parallel strain in a pseudomorphic film will be nearly or approximately equal to the difference in lattice parameters between an unstrained substrate parallel to the interface and an unstrained epitaxial layer parallel to the interface.

Active structure 115 is configured for the emission of light in response to an applied voltage. Thus, the active structure 115 may include a multiple-quantum well ("MQW") layer 125 disposed above bottom contact layer 120. In various embodiments, MQW layer 125 is disposed directly on the bottom contact layer 120. In other embodiments, an optional layer (e.g., an undoped layer including, consisting essentially of, or consisting of an undoped semiconductor material such as AlGaN) may be disposed between the bottom contact layer 120 and the MQW layer 125. The MQW layer 125 may be doped with the same doping polarity as the bottom contact layer 120, e.g., n-type doped. The MQW layer 125 may include, consist essentially of, or consist of one or more quantum wells separated by (or surrounded on both sides by) barriers. For example, each period of MQW layer 125 may feature an $Al_xGa_{1-x}N$ quantum well and an $Al_yGa_{1-y}N$ barrier, where x is different from y. Typically, y is greater than 0.4 for light-emitting devices designed to emit light having a wavelength less than 300 nm and may be greater than 0.7 for shorter-wavelength emitters. It may even be greater than 0.9 for devices designed to emit at wavelengths shorter than 250 nm. The value of x will, at least in part, determine the emission wavelength of the device. For emission wavelengths longer than 280 nm, x may be as low as 0.2. For wavelengths between 250 nm and 280 nm, x may vary between 0.2 and 0.7. For wavelengths shorter than 250 nm, x may be greater than 0.6. In various embodiments, the difference between x and y is large enough to obtain good confinement of the electrons and holes in the active region, thus enabling high ratio of radiative recombination to non-radiative recombination. In an embodiment, the difference between x and y is approximately 0.25, e.g., x is approximately 0.5 and y is approximately 0.75. MQW layer 125 may include a plurality of such periods, and may have a total thickness ranging from 20 nm to 100 nm, or less than approximately 50 nm. In various embodiments of the invention, the active light-emitting structure 115 is configured to (e.g., has a MQW layer 125 having layer composition(s) selected to) emit ultraviolet light.

In various embodiments of the invention, an electron-blocking layer 130 may be disposed over MQW layer 125. The electron-blocking layer 130 typically has a wider band gap than that of a band gap within the MQW layer 125 (e.g., a band gap of the barrier layers therewithin). In various embodiments, the electron-blocking layer 130 may include, consist essentially of, or consist of e.g., $Al_xGa_{1-x}N$, and electron-blocking layer 130 may be doped. For example, the electron-blocking layer 130 may be doped with the same doping polarity as that of bottom contact layer 120 and/or MQW layer 125 (e.g., n-type doped). In various embodiments, the value of x in the electron-blocking layer 130 is greater than the value of the Al mole fraction in the barrier layers used in the MQW layer 125. For longer wavelength devices with emission wavelengths greater than 300 nm, x may be as low as 0.4 and may be greater than 0.7 for shorter wavelength devices. It may even be greater than 0.9 for devices designed to emit at wavelengths shorter than 250 nm. Electron-blocking layer 130 may have a thickness that may range, for example, between approximately 10 nm and approximately 50 nm, or even between approximately 10 nm and approximately 30 nm. In various embodiments of the invention, the electron-blocking layer 130 is sufficiently thin (e.g., thickness less than about 30 nm, or less than about 20 nm) so as to facilitate carrier (e.g., hole) tunneling through the electron-blocking layer 130. In various embodiments of the invention, the electron-blocking layer 130 is omitted from device structure 100.

As shown in FIG. 1, device structure 100 may also include a graded layer 135 disposed above the electron-blocking layer 130 (or above the MQW layer 125 in embodiments in which electron-blocking layer 130 is omitted), and a cap layer (or "top contact layer") 140 may be disposed over the graded layer 135. The cap layer 140 may be doped with a doping polarity opposite of that of the bottom contact layer 120, e.g., p-type doped with one or more dopants such as Mg, Be, and/or Zn. In other embodiments, the cap layer 140 may be undoped, as carriers (e.g., holes) may be injected from an electrode into a two-dimensional carrier gas disposed at the interface between the cap layer 140 and the graded layer 135. (While in exemplary embodiments described herein the cap layer 140 is doped p-type and the bottom contact layer 120 is doped n-type, embodiments in which the doping polarities of these layers are switched are within the scope of the present invention; in such embodiments, the electron-blocking layer 130, if present, may be considered to be a "hole-blocking layer," as understood by those of skill in the art.) The cap layer 140 may have a thickness ranging from, e.g., approximately 1 nm to approximately 100 nm, or approximately 1 nm to approximately 50 nm, or approximately 1 nm to approximately 20 nm. In various embodiments, the cap layer 140 includes, consists essentially of, or consists of $Al_xGa_{1-x}N$, and in various embodiments the aluminum concentration x may range from 0 (i.e., pure GaN) to approximately 0.2.

The device structure 100 may also incorporate a metallic contact to facilitate electrical contact to the device. For example, the metallic contact may include or consist essentially of an electrode layer 145 disposed above or on the cap layer 140. The composition and/or shape of the electrode layer 145 are not particularly limited as long as it enables the injection of carriers (e.g., holes) into the cap layer 140. In embodiments in which holes are injected into a p-type doped nitride-based semiconductor cap layer 140, the electrode layer 145 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). In embodiments in which electrons are injected into an n-type doped nitride-based semiconductor cap layer 140, the electrode layer 145 may include, consist essentially of, or consist of one or more metals, e.g., Ti, Al, Au, Pt, Ni, and/or V, alloys or mixtures of two or more of these metals, or oxide-based and/or transparent electrode materials such as indium tin oxide (ITO). Electrode layers 145 in accordance with embodiments of the invention are not limited to these materials. The thickness of the electrode layer 145 may be, for example, between approximately 10 nm and approximately 100 nm, or between approximately 10 nm and approximately 50 nm, or between approximately 10 nm and approximately 30 nm, or between approximately 25 nm and approximately 40 nm. In various embodiments, the electrode layer 145 is formed after removal of all or a portion of the substrate 105. Various figures after FIG. 1 therefore omit the electrode layer 145 for clarity.

As mentioned above, embodiments of the present invention feature a graded layer 135 disposed between the cap layer 140 and the electron-blocking layer 130 (or the MQW layer 115 in embodiments in which the electron-blocking layer 130 is omitted). The graded layer 135 typically includes, consists essentially of, or consists of a nitride semiconductor, e.g., a mixture or alloy of Ga, In, and/or Al with N. The compositional gradient within graded layer 135 may be substantially continuous or stepped, and the grading rate within the graded layer 135 may be substantially constant or may change one or more times within the thickness of graded layer 135. The graded layer 135 may be undoped. In other embodiments, the graded layer 135 is doped n-type or p-type with one or more dopants, e.g., C, H, F, O, Mg, Be, Zn, and/or Si. The thickness of the graded layer 135 may be, for example, between approximately 5 nm and approximately 100 nm, between approximately 10 nm and approximately 50 nm, or between approximately 20 nm and approximately 40 nm. In various embodiments, the epitaxial growth process utilized to form the various layers of the device structure 100 may be temporarily halted between growth of the graded layer 135 and the underlying layer and/or the overlying layer. In various embodiments, the graded layer 135 is pseudomorphically strained to one or more of the underlying layers.

In various embodiments of the invention, one or more (or even all) of the layers of device structure 100 formed over substrate 105 may be pseudomorphically strained, similar to device layers described in U.S. Pat. No. 9,437,430, filed on Jan. 25, 2008, U.S. Pat. No. 8,080,833, filed on Apr. 21, 2010, and U.S. Pat. No. 9,299,880, filed on Mar. 13, 2014, the entire disclosure of each of which is incorporated by reference herein. Thus, as detailed therein, in various embodiments, one or more of the layers of device structure 100 may be pseudomorphic and may have a thickness greater than its predicted (e.g., via the Maxwell-Blakeslee theory) critical thickness. Moreover, the collective layer structure of device structure 100 may have a total thickness greater than the predicted critical thickness for the layers considered collectively (i.e., for a multiple-layer structure, the entire structure has a predicted critical thickness even when each individual layer would be less than a predicted critical thickness thereof considered in isolation). In other embodiments, one or more layers of device structure 100 are pseudomorphically strained and cap layer 140 is partially or substantially fully relaxed. For example, the lattice mismatch between cap layer 140 and substrate 105 and/or MQW layer 135 may be greater than approximately 1%, greater than approximately 2%, or even greater than approximately 3%. In an exemplary embodiment, cap layer 140 includes, consists essentially of, or consists of undoped or doped GaN, substrate 105 includes, consists essentially of, or consists of doped or undoped AlN (e.g., single-crystal AlN), and MQW layer 125 includes, consists essentially of, or consists of multiple $Al_{0.55}Ga_{0.45}N$ quantum wells interleaved with $Al_{0.75}Ga_{0.25}N$ barrier layers, and cap layer 140 is lattice mismatched by approximately 2.4%. Cap layer 140 may be substantially relaxed, i.e., may have a lattice parameter approximately equal to its theoretical unstrained lattice constant. A partially or substantially relaxed cap layer 140 may contain strain-relieving dislocations having segments threading to the surface of cap layer 140 (such dislocations may be termed "threading dislocations"). The threading dislocation density of a relaxed cap layer 140 may be larger than that of substrate 105 and/or layers underlying cap layer 140 by, e.g., one, two, or three orders of magnitude, or even larger.

In accordance with embodiments of the present invention, application of light (e.g., laser light) is utilized to separate the substrate 105 from the rest of device structure 100. As shown in FIG. 2A, the device structure 100 may be attached to a handle wafer 200 by, for example, wafer bonding or an adhesive material. In various embodiments, the device structure 100 may be wafer bonded to the handle wafer 200 via use of an intermediate material such as, for example, photoresist (e.g., SU-8), glass frit, an organic material such as benzocyclobutene (BCB), etc. Wafer bonding techniques, including reversible ones (i.e., techniques in which the handle wafer is straightforwardly removed after bonding and processing) are known to those of skill in the art and may be accomplished without undue experimentation.

The handle wafer 200 may be at least substantially transparent to light emitted by the active structure 115. The handle wafer 200 may include, consist essentially of, or consist of, for example, one or more semiconductor materials, sapphire, quartz, etc. Afterwards, light 210 having a wavelength corresponding to an absorption band within release layer 110 (e.g., approximately 310 nm for oxygen-doped AlN) may be emitted into the device structure 100 (e.g., from below the substrate 105 and/or from one or more sides of the bonded structure). (As utilized herein, a wavelength "corresponding to" an absorption band is sufficiently close to the absorption band such that an amount of the light sufficient to effect at least partial release of an underlying substrate and/or layer is absorbable within the layer having the absorption band.) In various embodiments, light 210 is primarily composed of or contains a wavelength that is within ±20 nm, within ±10 nm, within ±5 nm, within ±2 nm, or within ±1 nm of the wavelength of an absorption band within the release layer 110. In various embodiments, the release layer 110 may have more than one absorption band (due to, e.g., introduction of two or more different dopants), and the light 210 may be primarily composed of or contain one or more wavelengths that are within ±20 nm, within ±10 nm, within ±5 nm, within ±2 nm, or within ±1 nm of the wavelength of one or more of the absorption bands within the release layer 110. The light 210 propagates through the substrate 105 and is strongly absorbed within the release layer 110. In various embodiments, the release layer 110 has a lower thermal conductivity than that of the substrate 105 due to, e.g., the presence of one or more dopants within the release layer 110. Absorption of the light 210 within the release layer 110 results in local heating within the release layer 110, which may be magnified for release layers 110 having lower thermal conductivity. The local heating results in crack formation and subsequent fracture within the release layer 110 and/or at the interface between release layer 110 and substrate 105, thereby removing the substrate 105 (or at least a portion thereof) from device structure 100, as shown in FIG. 2B. In various embodiments of the invention, the light 210 may be applied at a fluence ranging from, for example, approximately 500 mJ/cm$^2$ to approximately 1000 mJ/cm$^2$. In various embodiments of the invention, the light 210 may be applied as one or more pulses. Such pulses may have durations ranging from, for example, approximately 10 ms to approximately 100 ms.

As mentioned above, the substrate 105 may contain a separate substrate release layer (e.g., a region doped with one or more of the dopants referenced above via, for example, diffusion or ion implantation) therewithin in addition to release layer 110. In such embodiments, exposure to light corresponding to the absorption band of the substrate release layer enables the removal of the portion of the substrate 105 underlying the substrate release layer, and subsequent exposure to light corresponding to the absorption band of the release layer 110 enables the removal of the remaining portion of the substrate 105 and/or any remaining layer(s) below the release layer 110.

In various embodiments, at least a portion of the release layer 110 remains attached to the substrate 105 upon removal of the substrate 105. After removal of the substrate 105, any remaining portion of the release layer 110 may be removed (e.g., by selective etching or grinding and/or polishing). A metallic contact may be formed in contact with the bottom contact layer 120, and the device structure 100 may be utilized to emit light without absorption thereof by substrate 105. The metallic contact may be formed on the "bottom" surface of the bottom contact layer 120 (i.e., the surface of the bottom contact layer 120 opposite the top contact layer), or a portion of the structure may be etched away so that the metallic contact may be formed on a thusly revealed "top" surface of the bottom contact layer (i.e., the surface of the bottom contact layer 120 opposite the prior location of substrate 105). In various embodiments, the handle wafer 200 is removed from the device structure 100, while in other embodiments, the handle wafer 200 remains attached to the device structure 100.

Various embodiments of the invention utilize a patterned substrate 105 in conjunction with, or even instead of, a release layer 110 in order to facilitate removal of all or a portion of substrate 105 from device structure 100. As shown in FIG. 3A, the top surface of substrate 105 may be patterned to include one or more trenches, mesas, recesses, and/or projections that provide the top surface of substrate 105 with a non-planar topography. For example, portions of the top surface of substrate 105 may be covered with a masking material (e.g., via conventional photolithography processes), and other portions of the top surface may be removed by, e.g., wet or plasma etching. As shown, when active structure 115 is grown over the patterned substrate 105, the epitaxial layers grow both vertically and laterally, eventually forming enclosed voids 300. For example, as known to those of skill in the art, varying epitaxial growth parameters, such as the V:III ratio, may be utilized to vary the ratio of lateral and vertical growth rates during epitaxial deposition of III-V semiconductor layers (e.g., GaN, AlN, InN, and alloys thereof). In this manner, the active structure 115 may be deposited over the patterned substrate 105 such that enclosed voids are formed before resumption of substrate-wide growth, as shown in FIG. 3A, without undue experimentation. For example, embodiments of the invention may utilize growth procedures detailed in K. Nakano, et al., "Epitaxial lateral overgrowth of AlN layers on patterned sapphire substrates," physica status solidi (a), Vol. 203, No. 7, May 2006, pp. 1632-1635, the entire disclosure of which is incorporated by reference herein.

The device structure 100 may be attached to handle wafer 200, and then radiation 310 (e.g., light such as laser light and/or heat) may be applied to the substrate 105. During application of the radiation 310, the voids 310 act as nucleation sites for cracking and fracture, leading to the removal of all or a portion of substrate 105, as shown in FIG. 3B. Embodiments of the invention may utilize a release layer 110 in conjunction with the patterned substrate 300, and thus the voids may form at least partially within the release layer 110. In such embodiments, radiation 310 may include, consist essentially of, or consist of light having a wavelength corresponding to an absorption band within the release layer 110.

In various embodiments of the invention, the voids 300 may alternatively be utilized as an etch stop for removal of all or a portion of the substrate 105 by processes such as etching, grinding, and/or polishing (e.g., chemical mechanical polishing). Etchants that may be utilized in accordance with embodiments of the invention include, for example, KOH, NaOH, TMAH, $H_3PO_4$, or combinations thereof. As shown in FIG. 3C, portions of the substrate 105 may be removed until the voids 300 are revealed, resulting in a structure in which isolated substrate portions 320 remain disposed under the active structure 115 on pillars defined thereby. (As utilized herein, "pillars" are features separated from each other by trenches or other recesses therebetween and that may have any cross-section and shape; for example, trenches may be square, rectangular, polygonal, quadrilateral, or circular in cross-section, and the cross-sectional shape and/or size of a pillar may vary along its height. Pillars typically, but do not necessarily, have substantially planar top surfaces.) In various embodiments, such substrate portions 320 may be removed by, for example, additional etching, grinding, and/or polishing. In other embodiments, the substrate portions 320 may be shaped by, e.g., non-conformal etching and/or by polishing, which in various embodiments will remove material at the edges of substrate portions 320 at a higher rate. In an exemplary process, grinding with in-situ thickness monitoring may be utilized to remove most of the material to be removed, followed by a slower removal procedure (e.g., with a softer grinding wheel or pad), followed by CMP for final material removal, shaping, and removal of any grinding damage.

Shaped substrate portions 320 may advantageously increase photon extraction efficiency from the bottom surface of active structure 115. For example, the substrate portions 320 may be curved or substantially hemispherical, substantially conical, or pyramidal. In other embodiments, the substrate portions 320 may also or instead be roughened or textured to aid light extraction therefrom. In various embodiments, each substrate portion 320 may define multiple shaped features, e.g., multiple cones or hemispheres. In various embodiments, substrate portions 320 have a thickness ranging from, for example, approximately 0.5 μm to approximately 10 μm. In various embodiments, substrate portions 320 are absent or are completely removed, and a surface portion of remaining active structure 115 is shaped (e.g., to be curved, substantially hemispherical, substantially conical, or pyramidal) as detailed above for substrate portions 320.

Figure 4A:
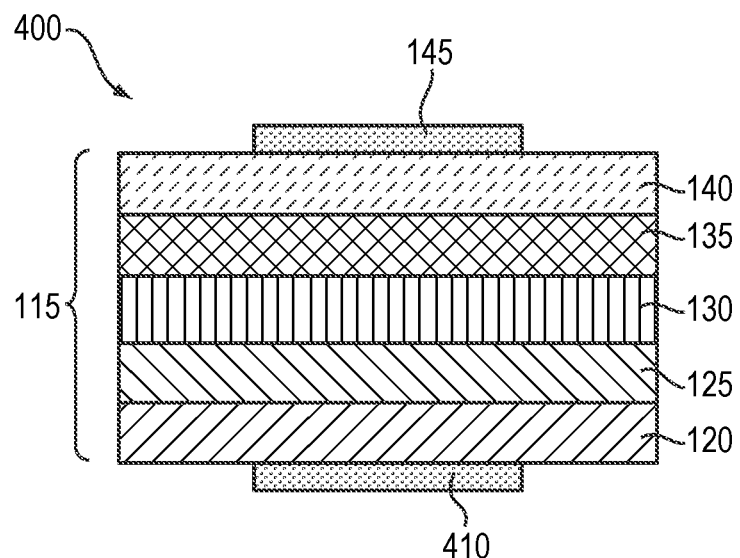
FIG. 4A is a schematic cross-section of a light-emitting device structure after substrate removal in accordance with various embodiments of the invention.
Figure 4B:
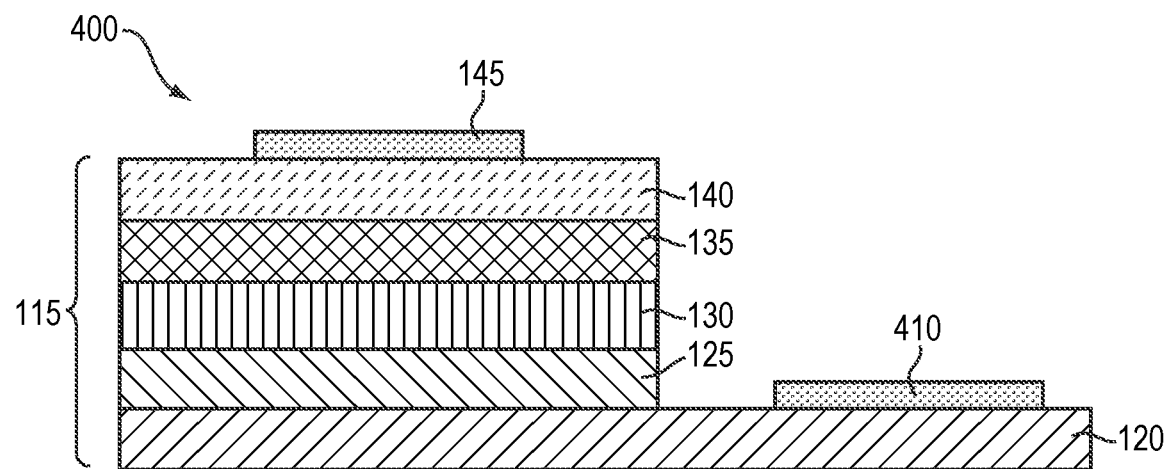
FIG. 4B is a schematic cross-section of a light-emitting device structure after substrate removal in accordance with various embodiments of the invention.

As mentioned above, after removal of all or a portion of the substrate 105, electrical contacts may be made to the bottom contact layer 120 and the cap layer 140 so that power may be applied to the device structure 100, resulting in light emission therefrom. FIGS. 4A and 4B depict different device structures 400 in accordance with various embodiments, in which a bottom electrode layer 410 is formed below the newly exposed bottom contact layer 120 after removal of the substrate 105 (FIG. 4A) and on top of a portion of bottom contact layer 120 after removal of the substrate 105 and masking and removal of a portion of the active structure 115 (FIG. 4B). The composition and/or shape of the bottom electrode layer 410 are not particularly limited as long as it enables the injection of carriers (e.g., electrons) into the bottom contact layer 120. In embodiments in which electrons are injected into an n-type doped nitride-based semiconductor bottom contact layer 120, the bottom electrode layer 410 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 120, the bottom electrode layer 410 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 410 in accordance with embodiments of the invention are not limited to these materials. The thickness of the bottom electrode layer 410 may be, for example, between approximately 10 nm and approximately 100 nm, or between approximately 10 nm and approximately 50 nm, or between approximately 10 nm and approximately 30 nm, or between approximately 25 nm and approximately 40 nm.

After formation of the electrodes 145, 410, the resulting device 400 may be electrically connected to a package, for example as detailed in U.S. Pat. No. 9,293,670, filed on Apr. 6, 2015 (the '670 patent), the entire disclosure of which is incorporated by reference herein. A lens may also be positioned on the device 400 to transmit (and, in various embodiments, shape) the light emitted by the device 400. For example, a rigid lens may be disposed over the device 400 as described in the '670 patent or in U.S. Pat. No. 8,962,359, filed on Jul. 19, 2012, or in U.S. Pat. No. 9,935,247, filed on Jul. 23, 2015, the entire disclosure of each of which is incorporated by reference herein. After packaging, any handle wafer remaining on the active structure 115 may be removed.

Figure 5C:
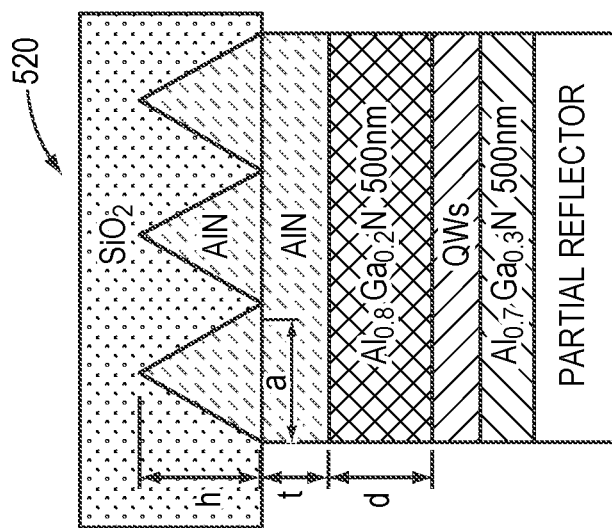
FIGS. 5A-5C are schematic cross-sections of simulated light-emitting devices in accordance with various embodiments of the invention.
Figure 5B:
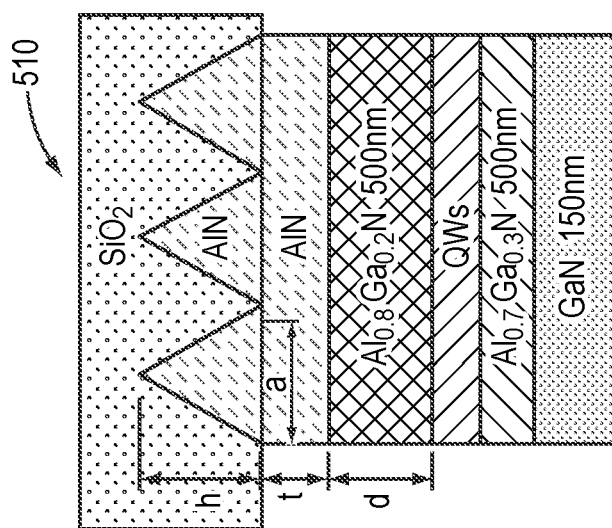
Figure 5A:
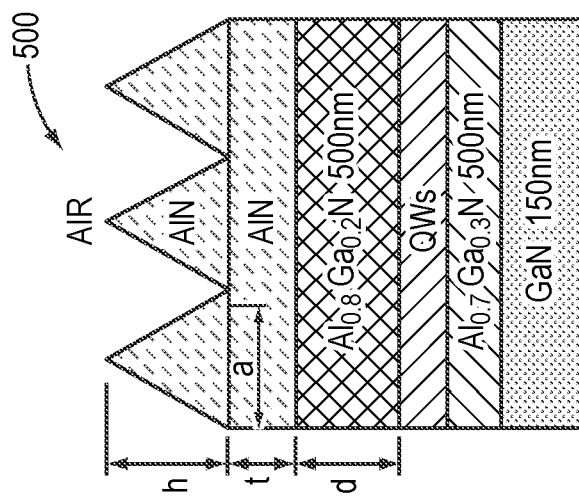

A series of simulations were performed in order to demonstrate the advantageous benefits of embodiments of the present invention—in particular the improvement of photon extraction efficiency enabled via substrate removal. FIG. 5A depicts a device 500 in which the AlN substrate thickness t was set to either 200 μm, 20 μm, or 1 μm (corresponding approximately to complete substrate removal), and the substrate surface has been patterned to form a series of conical structures having a height h of 5 μm and a base width a of 5.5 μm. (In FIGS. 5A-5C, the AlN substrate is depicted as the top of the device, as is the case for devices designed to emit light through the substrate.) Over the AlN substrate is disposed a $Al_{0.8}Ga_{0.2}N$ layer having a thickness d of 500 nm, the active light-emitting quantum wells, a $Al_{0.7}Ga_{0.3}N$ overlayer having a thickness of 100 nm, and a GaN cap layer having a thickness of 150 nm. FIG. 5B depicts a device 510 similar to device 500 but with the addition of a silica encapsulant layer formed over the AlN substrate. FIG. 5C depicts a device 520 similar to device 510 but with the GaN cap layer replaced by a partial reflector layer having a reflectivity to light emitted by the quantum wells of either 20% or 50%. Commercial ray tracing software (ZEMAX, available from Zemax LLC of Kirkland, Wash.) was used to model the extraction efficiency of 265 nm photons generated in the quantum wells. The photons were modeled by assuming that all directions of emission from the quantum well layers were equally likely. The results of the simulations (reported as photon extraction efficiencies) are shown in the table below.

| Substrate Thickness t (μm) | Device 500 | Device 510 | Device 520 20% Reflector | Device 520 50% Reflector |
|---|---|---|---|---|
| 200 | 2.4% | 5.4% | 6.4% | 8.1% |
| 20 | 8.7% | 18.2% | 22.2% | 30.0% |
| 1 | 10.9% | 22.2% | 28.3% | 43.4% |

As shown in the table, combining substrate removal in accordance with embodiments of the present invention with other photon extraction techniques greatly enhances the efficacy of such techniques. For example, simply removing the substrate of device 500 increases the photon extraction efficiency by 4.5 times. On the other hand, removing the substrate with even a partial reflector (for example, the 50% reflector of device 520) increases the photon extraction by over 5 times, and this case exhibits a photon extraction efficiency nearly 20 times larger than that of device 500 prior to substrate removal. In embodiments of the present invention, use of a higher reflectance reflector (e.g., greater than 90%), when combined with substrate removal, may result in photon extraction efficiencies exceeding 80%.

The simulations detailed above were performed with the assumption that the photons generated in the quantum wells are equally likely to be emitted in all directions, as mentioned above. The actual behavior of the photons may diverge from that assumption, particularly as the wavelength of emitted light decreases. Thus, the actual benefits of substrate removal may be expected to exceed those demonstrated in the simple simulations provided herein. In addition, the simulations are designed to demonstrate relative benefits of various techniques described herein, rather than demonstrating the maximum possible impact and ultimate device performance afforded by techniques such as substrate removal.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An illumination device comprising:
    a first contact layer having a first polarity;
    a second contact layer having a second polarity opposite the first polarity, at least a portion of the second contact layer defining a plurality of pillars separated by recesses disposed therebetween;
    a light-emitting structure disposed between the first and second contact layers, the light-emitting structure comprising a multiple-quantum well layer comprising a plurality of periods each comprising a strained $Al_xGa_{1-x}N$ barrier and a strained $Al_yGa_{1-y}N$ quantum well, x and y being different by an amount facilitating confinement of charge carriers in the multiple-quantum well layer, and y being selected for emission of ultraviolet light by the light-emitting structure;
    a plurality of single-crystalline aluminum nitride caps, each of the aluminum nitride caps being disposed on a top surface of one of the pillars defined by the second contact layer;
    a first electrical contact disposed in direct mechanical contact with the first contact layer; and
    a second electrical contact disposed in direct mechanical contact with the second contact layer.

2. The device of claim 1, wherein each of the aluminum nitride caps has a curved top surface.

3. The device of claim 1, wherein each of the aluminum nitride caps is substantially hemispherical.

4. The device of claim 1, wherein each of the aluminum nitride caps is conical or pyramidal.

5. The device of claim 1, wherein the first and second electrical contacts are metallic.

6. An illumination device comprising:
    a first contact layer having a first polarity;
    a second contact layer having a second polarity opposite the first polarity, at least a portion of the second contact layer defining a plurality of pillars separated by recesses disposed therebetween;
    a light-emitting structure disposed between the first and second contact layers, the light-emitting structure comprising a multiple-quantum well layer comprising a plurality of periods each comprising a strained $Al_xGa_{1-x}N$ barrier and a strained $Al_yGa_{1-y}N$ quantum well, x and y being different by an amount facilitating confinement of charge carriers in the multiple-quantum well layer, and y being selected for emission of ultraviolet light by the light-emitting structure;
    a plurality of single-crystalline aluminum nitride caps, each of the aluminum nitride caps being disposed on a top surface of one of the pillars defined by the second contact layer; and
    an electrically insulating handle wafer affixed to the first contact layer.

7. The device of claim 6, wherein the handle wafer comprises at least one of glass, sapphire, or quartz.

8. The device of claim 6, wherein each of the aluminum nitride caps (i) has a curved top surface, (ii) is conical, or (iii) is pyramidal.

9. The device of claim 6, wherein the first and second electrical contacts are metallic.

10. A method of forming an illumination device, the method comprising:
    forming a crystalline release layer over or within an aluminum nitride substrate, the release layer (i) having an absorption band corresponding to a first wavelength of light and (ii) being strained at least in part due to lattice mismatch with the substrate;
    forming an active light-emitting device structure over the release layer; and
    exposing the release layer to light having the first wavelength, whereby absorption of the light by the release layer results in separation of at least a portion of the substrate from the active light-emitting device structure.

11. The method of claim 10, wherein the lattice mismatch of the release layer with the substrate is greater than 0.1%.

12. The method of claim 10, wherein the lattice mismatch of the release layer with the substrate is greater than 1%.

13. The method of claim 10, wherein the release layer is tensilely strained.

14. The method of claim 10, wherein the release layer is compressively strained.

15. The method of claim 10, wherein forming the release layer comprises intentionally introducing one or more dopants into at least a portion of the release layer.

16. The method of claim 15, wherein the one or more dopants are introduced during epitaxial growth of the at least a portion of the release layer.

17. The method of claim 15, wherein the one or more dopants are introduced via ion implantation or diffusion.

18. The method of claim 10, further comprising, before exposing the release layer to light, attaching the active light-emitting device structure to a handle wafer.

19. The method of claim 18, wherein the release layer is exposed to light through the handle wafer.

20. The method of claim 10, wherein the release layer is exposed to light through the aluminum nitride substrate.

21. A method of forming an illumination device, the method comprising:
    forming a release layer over or within an aluminum nitride substrate, the release layer (i) having an absorption band corresponding to a first wavelength of light and (ii) being strained at least in part due to lattice mismatch with the substrate;
    forming an active light-emitting device structure over the release layer; and
    exposing the release layer to light having the first wavelength, and applying, to the aluminum nitride substrate, additional heat beyond any heat resulting from exposure of the release layer to light having the first wavelength, whereby absorption of the light by the release layer results in separation of at least a portion of the substrate from the active light-emitting device structure.

22. The method of claim 21, wherein the lattice mismatch of the release layer with the substrate is greater than 0.1%.

23. The method of claim 21, wherein the lattice mismatch of the release layer with the substrate is greater than 1%.

24. The method of claim 21, wherein the release layer is tensilely strained.

25. The method of claim 21, wherein the release layer is compressively strained.

26. The method of claim 21, wherein forming the release layer comprises intentionally introducing one or more dopants into at least a portion of the release layer.

27. The method of claim 26, wherein the one or more dopants are introduced during epitaxial growth of the at least a portion of the release layer.

28. The method of claim 26, wherein the one or more dopants are introduced via ion implantation or diffusion.

29. The method of claim 21, further comprising, before exposing the release layer to light, attaching the active light-emitting device structure to a handle wafer.

30. The method of claim 29, wherein the release layer is exposed to light through the handle wafer.

31. The method of claim 21, wherein the release layer is exposed to light through the aluminum nitride substrate.

32. A method of forming an illumination device, the method comprising:
    providing a semiconductor structure comprising (i) an aluminum nitride substrate, (ii) a plurality of enclosed voids disposed over an entirety of the substrate and defined within a semiconductor material, and (ii) an active light-emitting device structure disposed over the substrate; and
    applying radiation proximate the voids, whereby heating of the voids and/or material proximate the voids by the radiation results in separation of at least a portion of the substrate from the active light-emitting device structure.

33. The method of claim 32, further comprising, before applying the radiation, attaching the semiconductor structure to a handle wafer, such that the active light-emitting device structure is disposed between the substrate and the handle wafer.

34. The method of claim 32, wherein the radiation is applied through the aluminum nitride substrate.

35. The method of claim 32, wherein the plurality of enclosed voids are defined within nitride semiconductor material.

36. A method of forming an illumination device, the method comprising:
    providing a semiconductor structure comprising (i) an aluminum nitride substrate, (ii) a plurality of enclosed voids disposed over the substrate and defined within a semiconductor material, and (ii) an active light-emitting device structure disposed over the substrate; and
    applying radiation proximate the voids, whereby heating of the voids and/or material proximate the voids by the radiation results in separation of at least a portion of the substrate from the active light-emitting device structure,
    wherein:
        the semiconductor structure comprises a release layer having an absorption band corresponding to a first wavelength of light; and
        at least a portion of the radiation applied proximate the voids comprises light of the first wavelength.

37. A method of forming an illumination device, the method comprising:
    providing a semiconductor structure comprising (i) an aluminum nitride substrate, (ii) a plurality of enclosed voids disposed over the substrate, and (ii) an active light-emitting device structure disposed over the substrate;
    attaching the semiconductor structure to a handle wafer; and
    thereafter, applying radiation proximate the voids, whereby heating of the voids and/or material proximate the voids by the radiation results in separation of at least a portion of the substrate from the active light-emitting device structure,
    wherein the radiation is applied through the handle wafer.

38. The method of claim 37, wherein:
    the semiconductor structure comprises a release layer having an absorption band corresponding to a first wavelength of light; and
    at least a portion of the radiation applied proximate the voids comprises light of the first wavelength.

* * * * *